US010368439B2

(12) United States Patent
Elsherbini et al.

(10) Patent No.: US 10,368,439 B2
(45) Date of Patent: Jul. 30, 2019

(54) ASSEMBLY ARCHITECTURE EMPLOYING ORGANIC SUPPORT FOR COMPACT AND IMPROVED ASSEMBLY THROUGHPUT

(71) Applicant: Intel Corporation, Santa Clara, CA (US)

(72) Inventors: Adel A. Elsherbini, Chandler, AZ (US); Aleksandar Aleksov, Chandler, AZ (US); Sasha N. Oster, Chandler, AZ (US); Shawna M. Liff, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 141 days.

(21) Appl. No.: 14/778,027

(22) PCT Filed: Dec. 26, 2014

(86) PCT No.: PCT/US2014/072446
§ 371 (c)(1),
(2) Date: Sep. 17, 2015

(87) PCT Pub. No.: WO2016/105435
PCT Pub. Date: Jun. 30, 2016

(65) Prior Publication Data
US 2016/0360618 A1    Dec. 8, 2016

(51) Int. Cl.
*H05K 7/00* (2006.01)
*H05K 1/11* (2006.01)
(Continued)

(52) U.S. Cl.
CPC .............. *H05K 1/115* (2013.01); *H01L 23/58* (2013.01); *H01L 25/16* (2013.01); *H05K 1/0284* (2013.01);
(Continued)

(58) Field of Classification Search
CPC .......... H05K 2201/10545; H05K 2201/10037; H05K 1/115; H05K 1/144; H05K 1/181;
(Continued)

(56) References Cited

U.S. PATENT DOCUMENTS 8,587,949 B2* 11/2013 Banhegyesi ......... G01R 22/065
340/870.02
2001/0030060 A1* 10/2001 Carroll ................ H01L 23/4985
174/260
(Continued)

FOREIGN PATENT DOCUMENTS

CN    1906758    1/2007
EP    2001050    12/2008
(Continued)

OTHER PUBLICATIONS

Intel Corporation, "International search report and written opinion", Application No. PCT/US2014/072446, (dated Sep. 25, 2015).
(Continued)

*Primary Examiner* — Yuriy Semenenko
(74) *Attorney, Agent, or Firm* — Schwabe, Williamson & Wyatt, P.C.

(57) ABSTRACT

An apparatus including a substrate including a first side and an opposite second side; at least one first circuit device on the first side of the substrate, at least one second device on the second side of the substrate; and a support on the second side of the substrate, the support including interconnections connected to the at least one first and second circuit device, the support having a thickness dimension operable to define a dimension from the substrate greater than a thickness dimension of the at least one second circuit device. A method including disposing at least one first circuit component on a first side of a substrate; disposing at least one second circuit component on a second side of the substrate; and coupling a support to the substrate, the substrate defin-
(Continued)

ing a dimension from the substrate greater than a thickness dimension of the at least one second circuit component.

18 Claims, 5 Drawing Sheets

(51) Int. Cl.
*H05K 1/14* (2006.01)
*H05K 1/18* (2006.01)
*H05K 3/30* (2006.01)
*H05K 3/36* (2006.01)
*H01L 25/16* (2006.01)
*H01L 23/58* (2006.01)
*H05K 1/02* (2006.01)

(52) U.S. Cl.
CPC .......... *H05K 1/0286* (2013.01); *H05K 1/144* (2013.01); *H05K 1/181* (2013.01); *H05K 3/303* (2013.01); *H05K 3/368* (2013.01); *H01L 2924/0002* (2013.01); *H05K 2201/042* (2013.01); *H05K 2201/09609* (2013.01); *H05K 2201/09636* (2013.01); *H05K 2201/09963* (2013.01); *H05K 2201/10037* (2013.01); *H05K 2201/10128* (2013.01); *H05K 2201/10378* (2013.01); *H05K 2201/10545* (2013.01); *H05K 2201/10583* (2013.01)

(58) Field of Classification Search
CPC ... H05K 2201/042; H05K 2201/10128; H05K 2201/10583; H05K 3/303; H05K 3/368; H01L 2924/0002; H01L 2924/00; H01L 25/16
USPC .......................................... 361/770, 790, 803
See application file for complete search history.

(56) References Cited

U.S. PATENT DOCUMENTS

| | | |
|---|---|---|
| 2005/0218516 A1 | 10/2005 | Lloyd et al. |
| 2008/0271220 A1 | 11/2008 | Chilton et al. |
| 2008/0283279 A1* | 11/2008 | Ogawa .................... H01L 23/13 174/255 |
| 2009/0316351 A1* | 12/2009 | Zadesky ............... G06F 1/1626 361/679.33 |
| 2010/0078781 A1 | 4/2010 | Ganesan et al. |
| 2010/0096743 A1 | 4/2010 | Ganesan et al. |
| 2010/0254109 A1 | 10/2010 | Nakamura et al. |
| 2014/0028968 A1* | 1/2014 | Olsson .................... G06F 1/163 351/158 |
| 2014/0131875 A1 | 5/2014 | Haba et al. |

FOREIGN PATENT DOCUMENTS

| | | | |
|---|---|---|---|
| JP | A-1994006027 | | 1/1994 |
| JP | 10074887 A | * | 3/1998 |
| JP | H10074887 A | | 3/1998 |
| JP | 2002305284 | | 10/2002 |
| JP | 2002314031 | | 10/2002 |
| JP | 2004254037 | * | 9/2004 |
| JP | A-2010225699 | | 7/2010 |
| KR | 20110042128 | | 4/2011 |
| TW | 201025541 | | 7/2010 |
| WO | WO-2014128795 | | 8/2014 |

OTHER PUBLICATIONS

Office Action for Taiwan Patent App. No. 104139136, dated Apr. 24, 2017, 5 pages.
Notice of Allowance for Taiwan Patent App. No. 104139136, dated Nov. 23, 2017, 6 pages.
Office Action for Korean Patent App. No. 2015-7033667, dated Sep. 9, 2017, 6 pages.
Office Action for Japanese Patent App. No. 2016-566847, dated Jul. 4, 2017, 5 pages.
Office Action for Japanese Patent App. No. 2016-566847, dated Jan. 9, 2018, 6 pages.
Office Action for Korean Patent App. No. 2015-7033667, dated Nov. 11, 2017, 6 pages with English translation.
Office Action for Chinese Patent App. No. 201480030428.9, dated Apr. 23, 2018, 7 pages no translation.
International Preliminary Report on Patentability for PCT Patent App. No. PCT/US2014/072446, dated Jul. 6, 2017, 9 pages.
Intel Corporation, "First Office Action", JP Application No. 2016-566847, (dated Jan. 31, 2017).
Intel Corporation, "Notice of Preliminary Rejection", KR Application No. 2015-7033667, (dated Mar. 17, 2017).
Search Report for European Patent Application No. 14892232.1 dated Aug. 31, 2018, 7 pages.
Office Action from Chinese Patent Application No. 201480030428.9 dated Dec. 21, 2018, 8 pages.
Office Action for Chinese Patent Application No. 201480030428.9, dated Mar. 27, 2019, 6 pgs.

* cited by examiner

ASSEMBLY ARCHITECTURE EMPLOYING ORGANIC SUPPORT FOR COMPACT AND IMPROVED ASSEMBLY THROUGHPUT

CROSS-REFERENCE TO RELATED APPLICATION

This patent application is a U.S. National Phase Application under 35 U.S.C. § 371 of International Application No. PCT/US2014/072446, filed Dec. 26, 2014, entitled ASSEMBLY ARCHITECTURE EMPLOYING ORGANIC SUPPORT FOR COMPACT AND IMPROVED ASSEMBLY THROUGHPUT.

BACKGROUND

Field

Integrated circuit assembly architecture.

Description of Related Art

Certain wearable systems benefit from a modular approach where a common subset of components are fabricated as a module on advanced package/board technology and then integrated with a full system (e.g., additional sensors, battery, display, etc.) through a flexible/rigid board. Such integration and assembly helps reduce the development cost and time to market.

For many of these modules, reducing an XY area can significantly reduce an overall system form factor and/or increase an available volume for other subsytems such as a battery and a display. One option for decreasing the footprint of system modules is through a double-sided assembly or package on package (PoP) configuration. This results in reduction of XY area at the expense of thickness or Z-height. For relatively thin wearable systems, the overall system Z-height is mostly limited by the battery since below a Z-height of about three millimeters (mm), an energy density of a battery tends to drop significantly. Since the Z-height is limited by the battery rather than a module in many wearable systems, it is preferable to make best use of the available area to reduce the XY area as much as possible until the Z-height of the module is or is almost as thick as the battery. A module employing a double-sided package/board configuration is one technique for exploiting available Z dimension area.

Current technologies for double-sided assembly on a module include using ball grid array (BGA) solder balls to make contact to a final system circuit board. This generally limits the application to placing only relatively short components (e.g., shorter than about 250 microns (μm)) on a back side of a module package/board.

Another technology uses a frame assembly (a rectangular PCB with a rectangular hole in the center). In general, such a frame is relatively expensive to fabricate and requires relatively complex assembly. Furthermore, frame warpage is a major concern and causes additional problems with the assembly.

DETAILED DESCRIPTION

In one embodiment, an apparatus is disclosed that is operable, for example, as a module including a component or a subset of components of a circuit system in a wearable system. Representatively, an apparatus includes a module substrate with at least one first circuit device on a first side of the module substrate and at least one second circuit device on an opposite second side of the module substrate. The apparatus also includes a support on the second side of the module substrate, having a thickness dimension operable to define a dimension from the module substrate greater than a thickness dimension (Z-dimension) of the at least one second circuit device thereon. In such manner, a support, such as one or more pillars or walls is operable to define a cavity or Z-dimension spacing when the apparatus is connected to, for example, a system circuit board. In one embodiment, the support such as a pillar(s) or wall(s), is made of an organic material and includes one or more interconnects therethrough.

In one embodiment, a support such as one or more pillars and/or walls extending from a module substrate are operable to define a cavity or a Z-dimension separation from an adjacent substrate such as a system circuit board. Representatively, a support may be made of a dielectric material such as a thermoset resin (e.g., FR4 resin) or other polymer that may or may not have a filler that includes one or more interconnections therethrough such as copper plated through holes therethrough (conductive vias that are filled with a conductive material or a non-conductive material) that are operable to connect on one side to contact points or pads to form circuits on the module substrate and on a second side to a board substrate through, for example, solder connections. Representatively, conventional printed circuit board technology may be used to form the supports (e.g., pillars, walls).

In another embodiment, an apparatus includes a module including a module substrate and one or more components connected to a board substrate through the use of a support such as pillars and/or walls. Still further, a method is directed at connecting a support such as a pillar(s) or wall(s) to a module substrate and connecting such module substrate to a board substrate such as a printed circuit board operable for use in a wearable assembly or other assembly.

Figure 1:
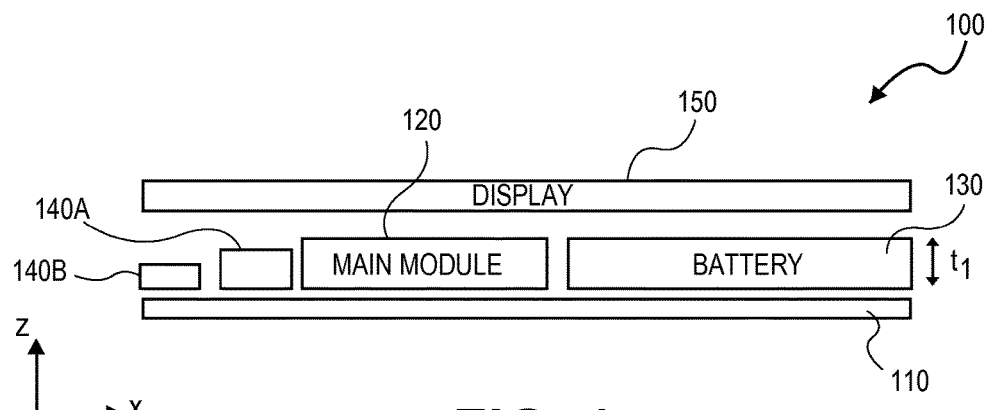
FIG. 1 shows a schematic cross-sectional side view of a circuit assembly that representatively may be used in a wearable system.

FIG. 1 shows a schematic cross-sectional side view of a circuit assembly that representatively may be used in a wearable system or other internet of things such as sensors on/in an animal (e.g., a cow) or inanimate object (e.g., a wall, a heating ventilation and air conditioning (HVAC) unit, an appliance (e.g., stove, microwave), an automobile, an airplane, a chair, etc.). Assembly 100 includes, in the embodiment shown, board substrate 110 that is, for example, a flexible or rigid printed circuit board having a form factor suitable, in one embodiment, for a wearable application. Disposed on and connected to contact points on a surface of board substrate 110 are devices including main module 120, battery 130 and optional additional sensors/components 140A and 140B. In one embodiment, a thickness dimension, $t_1$, of battery 130 is selected to provide acceptable energy density (efficiency). According to current battery performance characteristics, in one embodiment, thickness, $t_1$, is on the order of three millimeters (mm) or greater. Disposed on the devices connected to board 110 in the embodiment shown in FIG. 1 is display 150.

Also connected to a surface of board substrate 110 in the embodiment shown in FIG. 1 is main module 120. In one embodiment, main module 120 includes a subset of components operable for the performance of the circuit system. Representatively, main module 120 includes a microprocessor and other active devices (a component with an ability to electrically control electron flow) and one or more passive devices (a component incapable of controlling current by means of another electrical signal). Representatively passive devices include, but are not limited to, resistors, capacitors, inductors, transformers, oscillators, filters, sensors and diodes. In one embodiment, main module 120 has a thickness dimension similar to or approximating that of a thickness dimension, $t_1$, of battery 130 (e.g., 10 percent less than, 5 percent less than, 5 percent greater than, 10 percent greater than).

Figure 2:
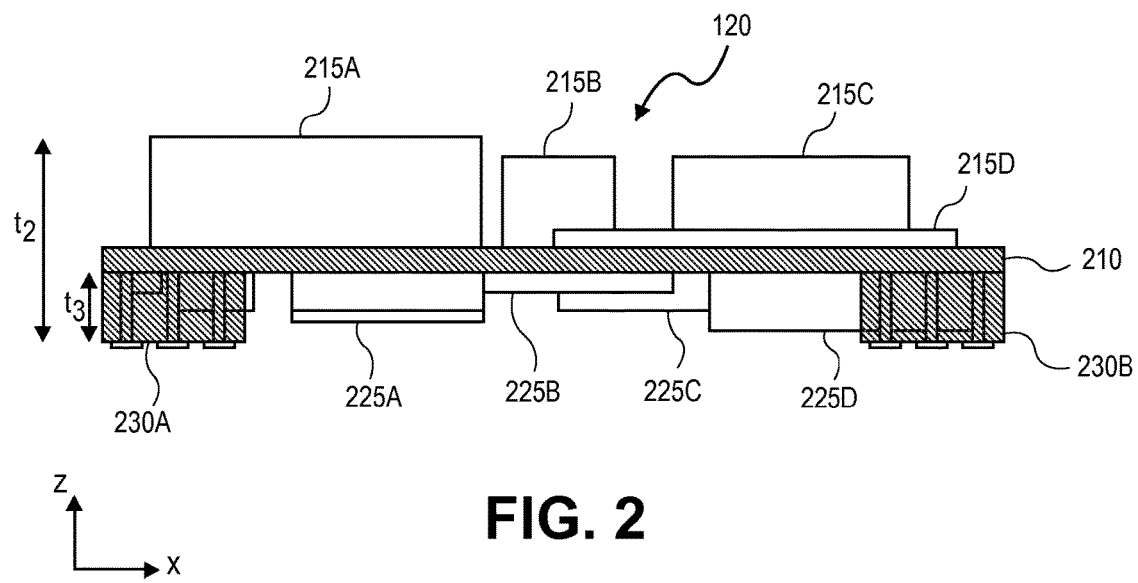
FIG. 2 shows a cross-sectional side view of an embodiment of a module in the circuit assembly of FIG. 1.
Figure 3:
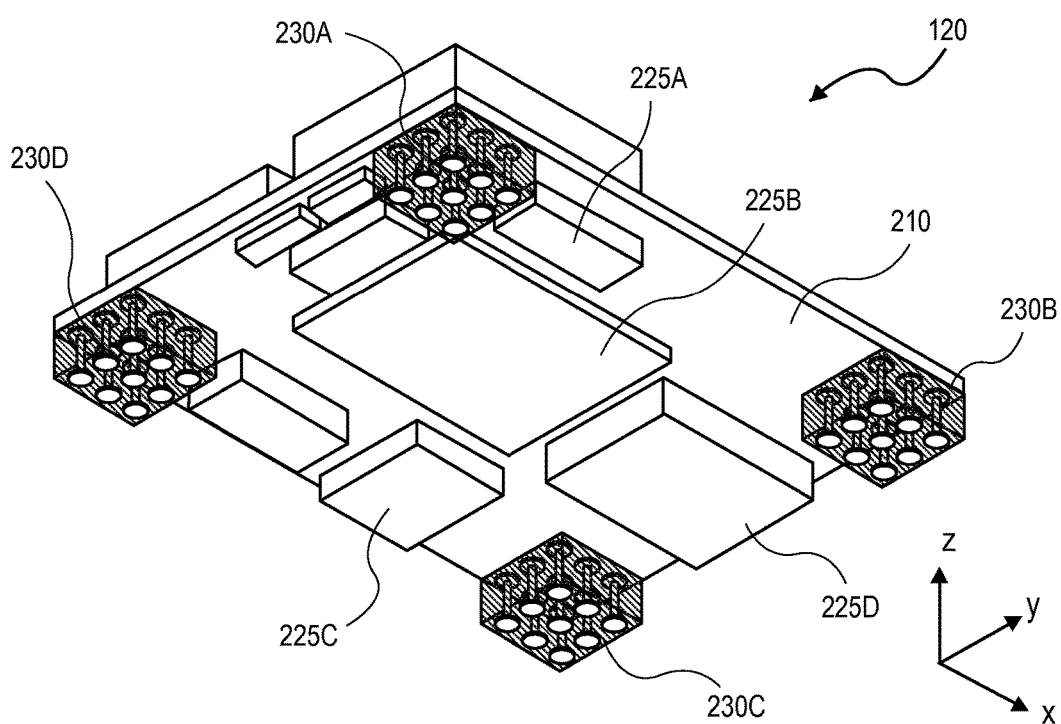
FIG. 3 shows a bottom perspective view of the module shown in FIG. 2.

FIG. 2 shows a cross-sectional side view of an embodiment of main module 120 in system 100. FIG. 3 shows a bottom perspective view of the main module shown in FIG. 2. Main module 120 includes module board 210 that is, for example, an organic board or package including conductive contact points or pads thereon (on opposing surfaces) and conductive traces thereon and/or therein. As shown in FIG. 2, in one embodiment, main module 120 includes circuit devices on opposing sides of module board 210. Representatively, FIG. 2 shows circuit device 215A, circuit device 215B, circuit device 215C and circuit device 215D on a first side or a top side of module board 210 (as viewed) with each circuit device electrically connected to contacts on the board. Disposed on an opposite second side or back side of module board 210, in this embodiment, are circuit device 225A, circuit device 225B, circuit device 225C and circuit device 225D, each also electrically connected to contacts on module board 210. Representatively, one or more circuit devices on first and/or second side of module board 210 is an active device such as a microprocessor. The other circuit devices may be active devices or passive devices and are operable to function as required by the system. In one embodiment, main module 120 has a thickness, $t_2$, that approximates a thickness of a battery associated with the system (battery 130, FIG. 1). Accordingly, where a battery thickness is on the order of 3 mm, main module 120 representatively has a thickness on the order of 3 mm or, in one embodiment, less than 3 min such as 2.7 mm. One advantage to a relatively thick main module (e.g., on the order of 3 mm) is that relatively thicker active and passive devices may be utilized in the module subsystem. Representatively, circuit devices 215A-215D and circuit devices 225A-225D may have thicknesses on the order of 1 mm or greater. Such a thickness dimension is often associated with a reduced cost compared to thinner devices preforming a similar function.

In addition to circuit devices 215A-215D and circuit devices 225A-225D, in one embodiment, in order to accommodate a double-sided assembly, main module 120 includes a support or supports connected to a second side (back side) of module board 210 and operable to provide a Z-dimension spacing or separation between a back side of module board 210 of main module 120 and board substrate 110 (FIG. 1). FIG. 2 and FIG. 3 show an embodiment of a support as multiple pillars, with pillar 230A, pillar 230B, pillar 230C and pillar 230D at respective corners of the second side or back side of module board 210. Each of pillars 230A-230D has a thickness dimension, $t_3$, operable to define a Z-dimension from module substrate 210 greater than a thickness dimension of circuit devices formed thereon (e.g., circuit devices 225A-225D). In this manner, pillars 230A-230D define a cavity or Z-dimension space between system board 110 (FIG. 1) and module board 210 to accommodate a Z-dimension or thickness dimension of circuit devices 225A-225D and allow such devices to clear or not contact system board 110 (see FIG. 1).

Figure 4:
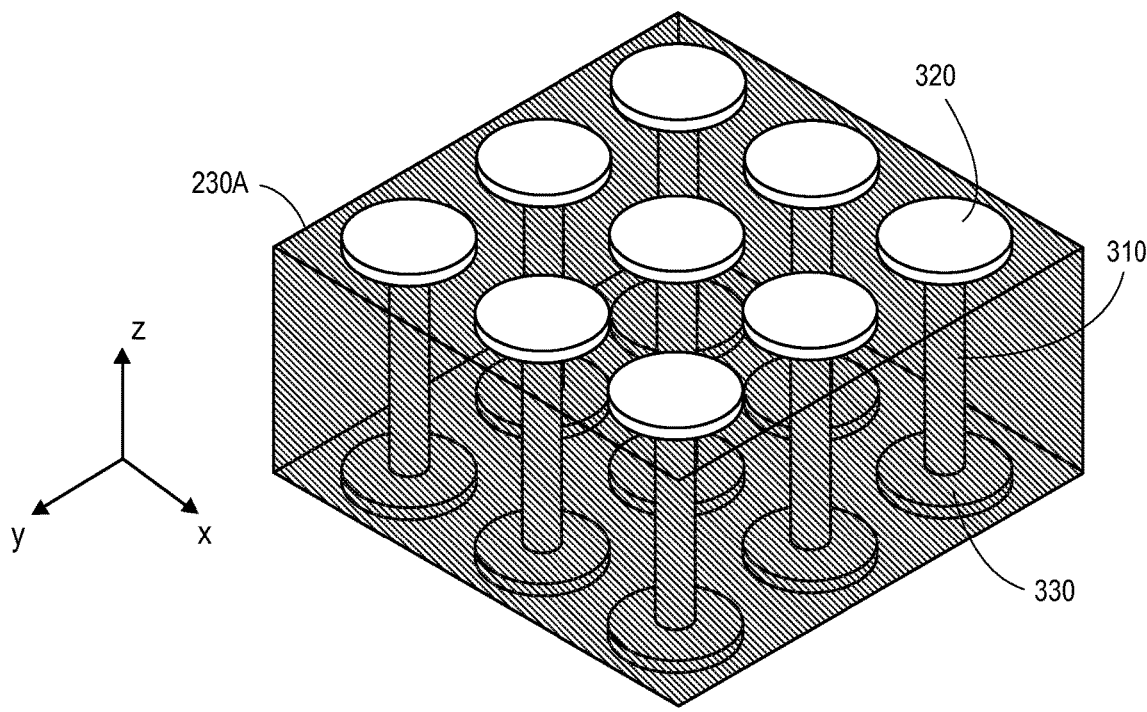
FIG. 4 shows an embodiment of a support as a pillar.

In one embodiment, each of pillars 230A-230D has a dielectric material body through which electrically conductive interconnections extend. Such interconnections provide connections between circuit devices 215A-215D and/or circuit devices 225A-225D and system board 110 (see FIG. 1). FIG. 4 shows pillar 230A. Pillar 230A includes, in this embodiment, a body having X- and Y-dimensions that are representatively equal to one another (e.g., a cube). In another embodiment, one of the X-dimension or Y-dimension may be greater than the other (e.g., a rectangular solid or orthotope with one of an XZ side dimension and a YZ side dimension being greater than the other or even non-rectilinear). It is appreciated that a pillar as a cube or a rectangular solid may or may not have orthogonal edges depending on how it is manufactured. Disposed through such body (in a Z-direction as viewed in FIG. 4) are one or more interconnections or plated through holes or conductive vias 310. In one embodiment, the number of interconnections through a pillar or other support is the minimum number to provide power, ground and signal connections between the main module and the system. By minimizing a number of interconnections through a pillar, a cross-sectional area (XY area) of a pillar can be minimized thereby minimizing an area occupied by such pillar in a main module. On a top surface of pillar 230A as viewed, contact pads 320 are disposed at one end of respective interconnections while on an opposite second or back side contacts pads 330 are disposed on an opposite end of respective interconnections.

It is appreciated that an embodiment of a support as multiple pillars does not require that respective ones of such pillars be at the corners or that there be four pillars, one for each corner. Such pillars may be positioned as necessary to provide Z-dimension spacing between module board 210 and a system board and possibly structural support of module board 210 as well as electrical connectivity between the module board and devices attached thereto.

In one embodiment, pillar 230A is fabricated using printed circuit board technology. Representatively, the pillars may be formed from a printed circuit board panel in which a number of representatively identical pillars are manufactured. Representatively, an organic material such as a thermal resin may be formed into a panel and areas of the panel designated for respective pillars. In this manner, the panel may be laser drilled for interconnect locations; the drilled openings are plated with, for example, a copper material to form interconnections 310; the openings are plugged, if not by the plating process, with a conductive material or a non-conductive material; and contact pads 320 and 330 are plated. Representatively, contact pads 320/330 have a minimum of three mil spacing therebetween, a five mil annular ring around a plated through hole and a four mil minimum plated through hole diameter. Such dimensions yield a minimum pitch on the order of 430 microns for a pillar. It is appreciated that such design rules can be adjusted to support smaller pitches if required. Following the manufacturing of the pillars in the panel, the panel may be broken apart into the individual pillar such as pillar 230A by a dicing or laser cut process. In one embodiment, a panel is diced using a saw or laser. By using a saw or laser rather than a mill as in a traditional printed circuit board dicing, reduces the wasted area of the board material. In another embodiment, rather than fabricating a support or supports using printed circuit board technology, a support or supports such as pillars may be fabricated into module board 210. Representatively, in a fabrication of board 210, pillars can be formed in designated area as part of the board itself using a substrate or board manufacturing processes and then a cavity or sections of the manufactured board can be removed (e.g., by an etching process) to leave one or more pillars in a desired area.

Figure 5:
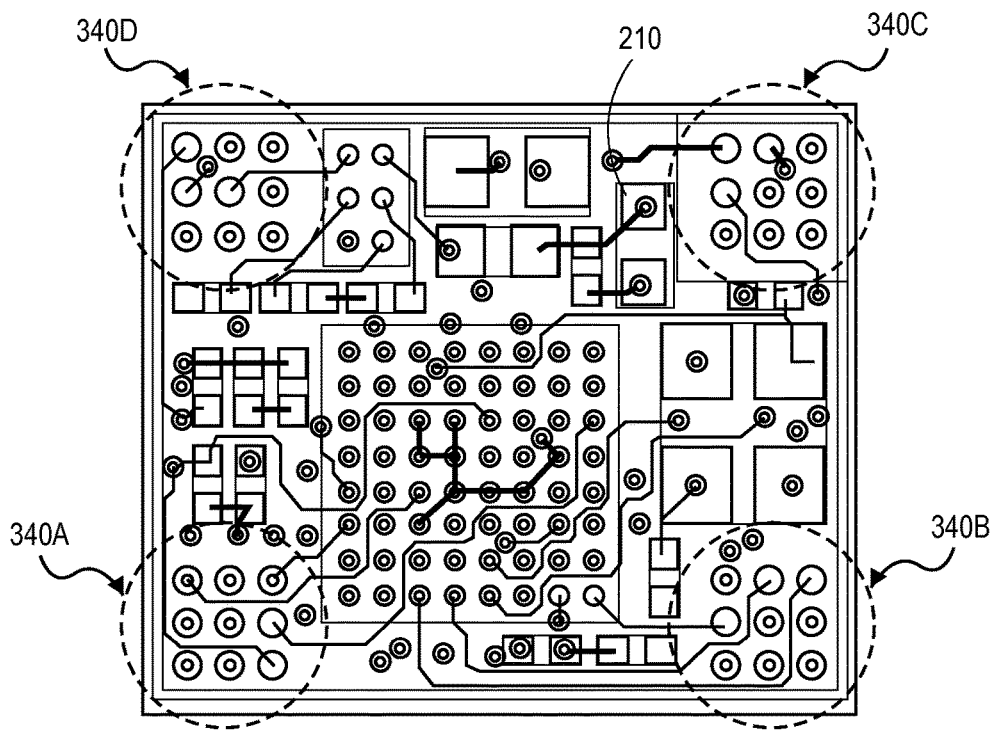
FIG. 5 representatively shows a bottom side of module board of the main module of FIG. 2 and representatively illustrates a layout for electrical connection of pillars and circuit devices.

A support in the form of pillars such as pillar 230A in FIG. 4 may be connected to module board 210 (FIG. 2) through, for example, solder connections between contact points or pads on module board 210 and contact pads 320 or 330 on a side of the pillar. FIG. 5 representatively shows a bottom side of module board 210 and representatively illustrates a layout for electrical connection of pillars 230A-230D and circuit devices 225A-225D. Representatively, module board 210 includes array 340 of six contact points or pads to which the six contact pads 320 of pillar 230A (FIG. 2) may be connected through, for example, solder connections. FIG. 5 also shows conductive pathways between the contact points or pads for various circuit devices to the support (pillar) areas for connection to contact pads of respective pillars.

Figure 6:
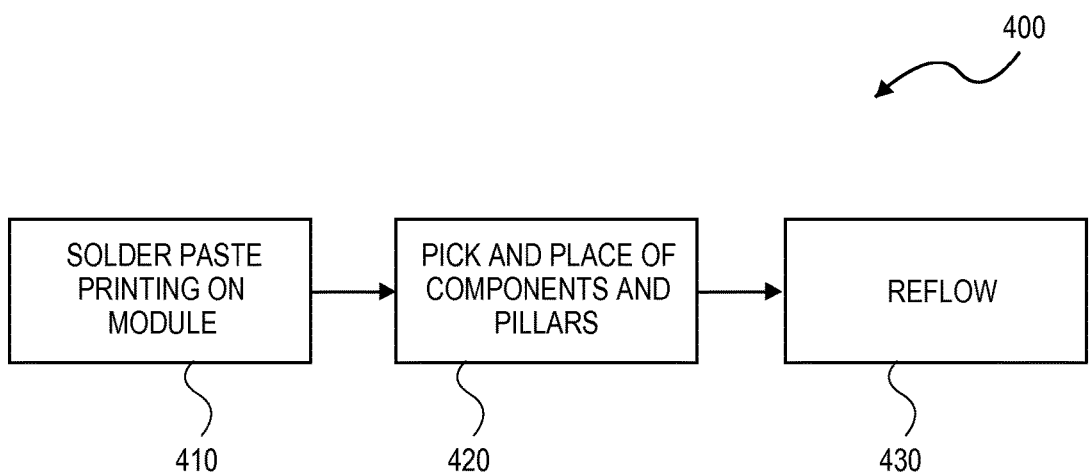
FIG. 6 shows an embodiment of a process flow for connecting a support of pillars to a main module.

As noted above, one way to connect pillars to module board 210 and to system board 110 is through solder connections. Representatively, solder balls may be added to the contact pad of a support (pillar) using conventional ball grid array ball placement or stencil printing. FIG. 6 presents a flow chart of a representative pick and place process for connecting pillars to a module board. Referring to process 400, in one embodiment the process includes introducing (e.g., printing) a solder paste on contact points or pads on a module board (block 410). Pillars may then be placed on the module board through a pick and place process in a tape and reel configuration as in conventional surface mount technology processes such that contact pads of the pillars are connected (through the solder paste) to contact points or pads on the module board (block 420). A reflow is used to secure the connection (block 430). In one embodiment, the pillars can be handled together with other passive components during their pick and place and reflowed together with any such other passive components. Thus, the integration of pillars does not require additional (extra) processing or additional process operations. Where the support is a pillar such as in FIG. 4, such solder balls may be placed on a full panel prior to the panel being singulated. In another embodiment, solder balls are not placed on the support but can be screen-printed directly on the module substrate. In an embodiment where a support or supports (e.g., pillar(s)) are built into a module substrate, solder balls may be placed on contacts of such support(s) through known assembly techniques (e.g., ball attach, paste printing).

Figure 7:
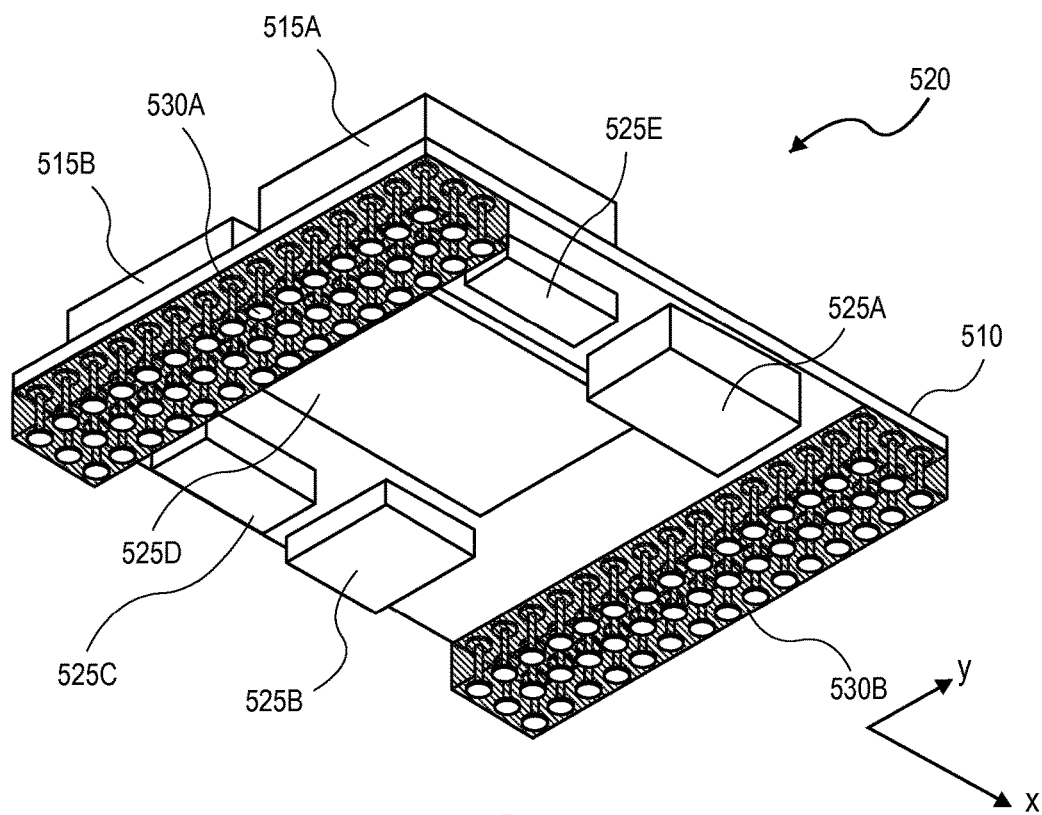
FIG. 7 shows another embodiment of a module including a support is in the form of walls along opposing sides of the module board.

In the embodiment described with reference to FIGS. 2-5, the support that defines a cavity or Z-dimension spacing between system board 110 and module board 210 and electrical connectivity therebetween is in the form of pillars each representatively having equivalent length and width dimensions (equivalent X and Y dimensions a cube). It is appreciated that such dimensions need not be equivalent. FIG. 7 shows another embodiment where a support is in the form of two walls along a side of the module board. Referring to FIG. 7, main module 520 includes module board 510 including circuit device 515A and circuit device 515B on one side (a front or top side) and circuit device 525A, circuit device 525B, circuit device 525C, circuit device 525D and circuit device 525E on an opposite second side or back side of the board (a side intended or operable for connection to a board substrate of an assembly). FIG. 7 also shows support 530A and support 530B as a rectangular wall along opposite sides of a bottom surface or back side surface of module board 510. Representatively, in this embodiment, each of support 530A and support 530B has a Y-dimension that is greater than an X-dimension. In one embodiment, the Y-dimension is twice the X-dimension and, in another embodiment, the Y-dimension may be more than twice the X-dimension. As shown, each support 530A and support 530B occupies an area corresponding to the entire length of a side of module board 510. In another embodiment, the support (a Y-dimension of the support) may be less than an entire length of a side of board 510 (e.g., one-half the length of a side of board 510). In another embodiment, a combination of supports may be utilized. Representatively, one side of a module board may have pillars at two corners defining a side of the board where, for example, an X-dimension of each pillar and a Y-dimension are similar (e.g., a cube) and an opposite side of the module board has a support wherein a Y-dimension is greater than an X-dimension (e.g., a rectangular pillar or a wall).

Figure 8:
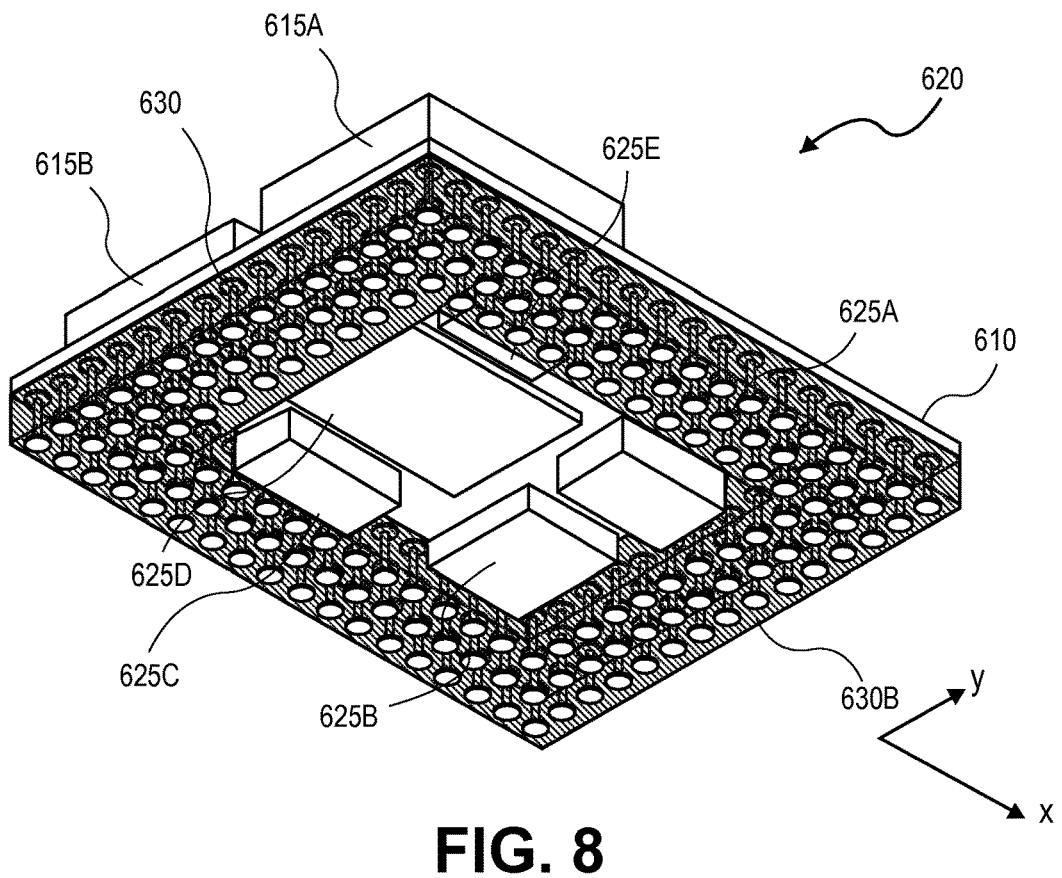
FIG. 8 shows another embodiment of a module including a support in a form of a frame.

FIG. 8 shows another embodiment where a support is in the form of a frame having sidewalls along multiple sides (e.g., two or more contiguous sides) of the module board. Referring to FIG. 8, main module 620 includes module board 610 including circuit device 615A and circuit device 615B on one side (a front or top side) and circuit device 625A, circuit device 625B, circuit device 625C and circuit device 625D on an opposite second side or back side of the board (a side intended or operable for connection to a board substrate of an assembly). FIG. 8 shows support 630 as a frame along and connected to each sidewall at a bottom surface or back side surface of module board 610. In the embodiment shown in FIG. 8, each sidewall of frame 630 has interconnections therethrough and contact points or pads on respective opposing surfaces. In one embodiment, the number of interconnections on each sidewall may vary and, in another embodiment, one or more sidewalls may not contain any interconnections therethrough.

Figure 9:
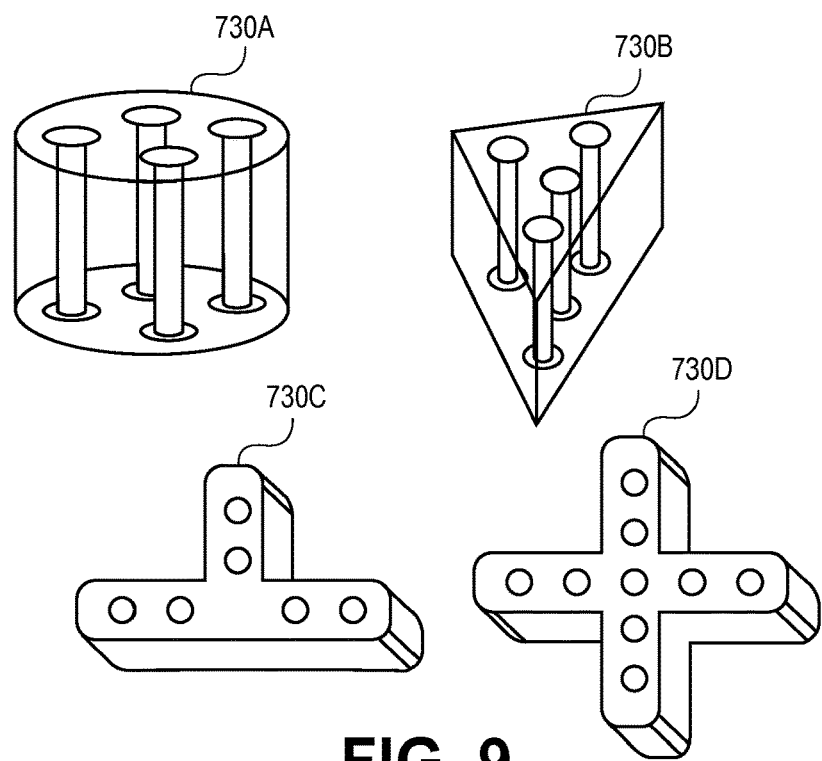
FIG. 9 shows top, side perspective views of pillars of various shapes.

FIG. 9 shows various shapes of a support as a pillar. FIG. 9 shows pillar 730A having a cylindrical shape; pillar 730B having a triangular cross-sectional shape; pillar 730C having a cross-sectional "T" shape; and pillar 730D having a cross-sectional "X" shape. The shapes presented in FIG. 9 are illustrative of possible shapes. In one embodiment, a shape and/or dimension of a support will depend, at least in part on the location on a back side of a module board, the number of devices or available area for a support and/or the number of interconnections needed between the module board and a system board. It is also appreciated that a support may be positioned in many different locations on a back side of module board depending in part, in one embodiment, on the factors mentioned. Finally, it is appreciated that where a support is multiple pillars connected to a module board, such pillars need not have a similar shape (e.g., one rectangular, one cylindrical).

The use of organic support(s) such as described allows devices having a thickness or Z-dimension of 1 mm or greater and a thickness or Z-dimension of the support may be independent of a pitch of interconnections therein. Further, in one embodiment, an area occupied by one or more supports on a back side of a module board can be minimized such as when an X-dimension and a Y-dimension of a support are similar (a pillar configuration) thereby increasing the available area on a back side of the module board. Thus, such a pillar configuration allows for improved area utilization compared to, for example, using a frame since, in one embodiment, circuit devices as wide as a width of a module board can be placed on a back side of such board. Also, as a module size of thermal/mechanical use conditions are different for wearables compared to conventional central processing units, the additional mechanical strength possibly achieved by a prior art frame is not required for many applications. Where a mechanical strength is needed, corner glues can be included.

EXAMPLES

Example 1 is an apparatus including a substrate comprising a first side and an opposite second side; at least one first circuit device on the first side of the substrate, at least one second device on the second side of the substrate; and a support on the second side of the substrate, the support including at least interconnections therethrough, respective ones of the interconnections are coupled to the at least one first circuit device and the at least one second circuit device, the support having a thickness dimension operable to define a dimension from the substrate greater than a thickness dimension of the at least one second circuit device.

In Example 2, the support of the apparatus of Example 1 includes one or more pillars.

In Example 3, one or more pillars of the apparatus of Example 2 are disposed at respective corners of the substrate.

In Example 4, the thickness of the apparatus of Example 1 includes a Z-dimension and the support also includes an X-dimension and a Y-dimension, wherein one of the X-dimension and the Y-dimension is greater than or equal to the other of the X-dimension and the Y-dimension.

In Example 5, one of the X-dimension and the Y-dimension of the apparatus of Example 4 is more than twice the other of the X-dimension and the Y-dimension.

In Example 6, the support of the apparatus of Example 1 includes an organic material body through which the interconnections extend.

Example 7 is an apparatus including a module including a module substrate and one or more circuit components coupled to the substrate; a board substrate; and a support coupled at a first end to the module substrate and at a second end to the board substrate, wherein the support includes an organic material body comprising one or more conductive interconnects therethrough, at least one of the one or more conductive interconnects could to a contact point on the module substrate and a contact point on the board substrate.

In Example 8, the support of the apparatus of Example 7 has a thickness dimension that defines a cavity between the module substrate and the board substrate suitable for one or more circuit components coupled to the module substrate.

In Example 9, the support of the apparatus of Example 7 includes one or more pillars.

In Example 10, one or more pillars of the apparatus of Example 8 are disposed at respective corners of the substrate.

In Example 11, the thickness of the apparatus of Example 7 includes a Z-dimension and the support also includes an X-dimension and a Y-dimension, wherein one of the X-dimension and the Y-dimension is greater than or equal to the other of the X-dimension and the Y-dimension.

In Example 12, the apparatus of Example 7 further includes a battery coupled to the board substrate.

In Example 13, the apparatus of Example 12 further includes one or more additional circuit components coupled to the board substrate.

In Example 14, the apparatus of Example 12 includes a wearable form factor.

In Example 15, the apparatus of Example 12 includes an internet of things.

Example 16 is a method including disposing at least one first circuit component on a first side of a substrate; disposing at least one second circuit component on a second side of the substrate; and coupling a support to the substrate, the substrate defining a dimension from the substrate greater than a thickness dimension of the at least one second circuit component.

In Example 17, support in the method of Example 16 includes one or more pillars.

In Example 18, coupling one or more pillars to the substrate in the method of Example 17 includes coupling at respective corners of the substrate.

In Example 19, the thickness in the method of Example 16 includes a Z-dimension and the support also comprises an X-dimension and a Y-dimension, wherein one of the X-dimension and the Y-dimension is greater than or equal to the other of the X-dimension and the Y-dimension.

In Example 20, one of the X-dimension and the Y-dimension in the method of Example 19 is more than twice the other of the X-dimension and the Y-dimension.

In Example 21, the support in the method of Example 16 includes a frame.

In Example 22, the substrate in the method of Example 16 includes a first substrate, the method further including coupling the support to a second substrate such that the at least one second circuit component is disposed between the first substrate and the second substrate.

In Example 23, a wearable assembly is made by any of the methods of Examples 16-22.

In Example 24, an internet of things is made by any of the methods of Examples 11-22.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
a substrate comprising a first side and an opposite second side;
at least one first circuit device on the first side of the substrate, at least one second circuit device on the second side of the substrate; and
a support on the second side of the substrate, the support comprising a plurality of pillars, each of the pillars having a two-dimensional array of interconnections therethrough, wherein two or more of the pillars have a different shape from one another, and wherein the interconnections are coupled to first contact pads on a first side of the support and second contact pads on an opposite second side of the support and wherein the first contact pads are coupled to substrate contact pads on the second side of the substrate, respective ones of the interconnections are coupled to the at least one first circuit device and the at least one second circuit device, the support having a thickness dimension operable to define a dimension from the substrate greater than a thickness dimension of the at least one second circuit device.

2. The apparatus of claim 1, wherein the plurality of pillars are disposed at respective corners of the substrate.

3. The apparatus of claim 1, wherein the thickness comprises a Z-dimension and the support also comprises an X-dimension and a Y-dimension, wherein one of the X-dimension and the Y-dimension is greater than or equal to the other of the X-dimension and the Y-dimension.

4. The apparatus of claim 3, wherein one of the X-dimension and the Y-dimension is more than twice the other of the X-dimension and the Y-dimension.

5. The apparatus of claim 1, wherein the support comprises an organic material body through which the interconnections extend.

6. An apparatus comprising:
a module comprising a module substrate and one or more circuit components coupled to the substrate;
a board substrate;
a support coupled at a first end to the module substrate and at a second end to the board substrate, wherein the support comprises an organic material body comprising a plurality of pillars, each of the pillars having a two-dimensional array of conductive interconnects therethrough, wherein two or more of the pillars have a different shape from one another, and wherein at least one of the two-dimensional array of conductive interconnects is coupled to a contact point on the module substrate and a contact point on the board substrate; and
a battery coupled to the board substrate, wherein the module has a thickness that is the same or less than a thickness of the battery.

7. The apparatus of claim 6, wherein the support has a thickness dimension that defines a cavity between the module substrate and the board substrate suitable for one or more circuit components coupled to the module substrate.

8. The apparatus of claim 6, wherein the plurality of pillars are disposed at respective corners of the substrate.

9. The apparatus of claim 6, wherein the thickness comprises a Z-dimension and the support also comprises an X-dimension and a Y-dimension, wherein one of the X-dimension and the Y-dimension is greater than or equal to the other of the X-dimension and the Y-dimension.

10. The apparatus of claim 6, further comprising one or more additional circuit components coupled to the board substrate.

11. The apparatus of claim 6, wherein the apparatus comprises a wearable form factor.

12. A method comprising:
disposing at least one first circuit component on a first side of a substrate;
disposing at least one second circuit component on a second side of the substrate; and
coupling a support to the substrate, the support defining a dimension from the substrate greater than a thickness dimension of the at least one second circuit component, wherein the support comprises a plurality of pillars, each of the pillars having a two-dimensional array of interconnections therethrough, wherein two or more of the pillars have a different shape from one another, and wherein the interconnections are coupled to first contact pads on a first side of the support and second contact pads on an opposite second side of the support and wherein the first contact pads are coupled to substrate contact pads on the second side of the substrate.

13. The method of claim 12, wherein coupling the plurality of pillars to the substrate comprising coupling at respective corners of the substrate.

14. The method of claim 12, wherein the thickness comprises a Z-dimension and the support also comprises an X-dimension and a Y-dimension, wherein one of the X-dimension and the Y-dimension is greater than or equal to the other of the X-dimension and the Y-dimension.

15. The method of claim 14, wherein one of the X-dimension and the Y-dimension is more than twice the other of the X-dimension and the Y-dimension.

16. The method of claim 12, wherein the support comprises a frame.

17. The method of claim 12, wherein the substrate comprises a first substrate, the method further comprising coupling the support to a second substrate such that the at least one second circuit component is disposed between the first substrate and the second substrate.

18. A wearable assembly made by the method of claim 12.

* * * * *